United States Patent
Qiu et al.

(10) Patent No.: US 12,538,772 B2
(45) Date of Patent: Jan. 27, 2026

(54) METHOD AND DEVICE FOR REPAIRING CIRCUIT ON ARRAY SUBSTRATE, AND ARRAY SUBSTRATE

(71) Applicants: CHUZHOU HKC OPTOELECTRONICS TECHNOLOGY CO., LTD., Chuzhou (CN); HKC CORPORATION LIMITED, Shenzhen (CN)

(72) Inventors: Tianhui Qiu, Chuzhou (CN); Baohong Kang, Chuzhou (CN)

(73) Assignees: CHUZHOU HKC OPTOELECTRONICS TECHNOLOGY CO., LTD., Chuzhou (CN); HKC CORPORATION LIMITED, Shenzhen (CN)

( * ) Notice: Subject to any disclaimer, the term of this patent is extended or adjusted under 35 U.S.C. 154(b) by 651 days.

(21) Appl. No.: 17/971,828

(22) Filed: Oct. 24, 2022

(65) Prior Publication Data
US 2023/0126811 A1   Apr. 27, 2023

(30) Foreign Application Priority Data
Oct. 27, 2021   (CN) .......................... 202111267390.5

(51) Int. Cl.
*H01L 21/768* (2006.01)
*G02F 1/1362* (2006.01)

(52) U.S. Cl.
CPC .. *H01L 21/76894* (2013.01); *G02F 1/136263* (2021.01)

(58) Field of Classification Search
CPC ......... G02F 1/136259; G02F 1/136263; G02F 1/1309; H01L 21/76894
See application file for complete search history.

(56) References Cited

U.S. PATENT DOCUMENTS

| | | | | |
|---|---|---|---|---|
| 2005/0110736 A1* | 5/2005 | Jinno | .................... | G09G 3/3208 345/92 |
| 2007/0206184 A1* | 9/2007 | Uto | .................... | G01N 21/4788 356/237.2 |
| 2018/0108687 A1* | 4/2018 | Zhao | .................... | H10D 86/441 |

FOREIGN PATENT DOCUMENTS

| | | | | |
|---|---|---|---|---|
| CN | 104280967 A | | 1/2015 | |
| CN | 105785678 A | | 7/2016 | |
| CN | 109491163 A | * | 3/2019 | ....... G02F 1/136259 |
| JP | 2007206641 A | | 8/2007 | |
| TW | 201040616 A | | 11/2010 | |

OTHER PUBLICATIONS

Grant Notification issued in counterpart Chinese Patent Application No. 202111267390.5, dated Jun. 29, 2023.

* cited by examiner

*Primary Examiner* — Davienne N Monbleau
*Assistant Examiner* — Emily Farmer
(74) *Attorney, Agent, or Firm* — Westbridge IP LLC

(57) ABSTRACT

Disclosed are a method and a device for repairing a circuit on an array substrate, and an array substrate. The method includes: determining a section to be repaired on each signal line; applying a conductive material to form a repair line between two ends of the section to be repaired, the repair line being connected with two ends of the section to be repaired; and applying an insulating material to form a cover layer above the repair line, the cover layer completely covers the surface of the repair line.

11 Claims, 3 Drawing Sheets

METHOD AND DEVICE FOR REPAIRING CIRCUIT ON ARRAY SUBSTRATE, AND ARRAY SUBSTRATE

CROSS-REFERENCE TO RELATED APPLICATIONS

This application claims priority to Chinese Patent Application No. 202111267390.5, filed on Oct. 27, 2021, the entire disclosure of which is incorporated herein by reference.

TECHNICAL FIELD

The present disclosure relates to the technology field of display panels, and in particular to a method and a device for repairing a circuit on an array substrate, and an array substrate.

BACKGROUND

In the manufacturing process of thin film transistor liquid crystal display (TFT-LCD), it is usually necessary to detect the condition of the circuit. Abnormal circuits are often repaired through laser chemical vapour deposition (LCVD) technology, so as to improve the production yield. With the appearance of high-performance machines such as ultra high definition (UD), the circuit on the substrate becomes much smaller, and when the circuit is repaired by using the LCVD technology, problems such as deviation during laser punching or via holes that are bigger than the circuit are likely to occur, which will affect the quality of the substrate and cause the display quality of the display panels to deteriorate.

SUMMARY

The main purpose of the present disclosure is to provide a method and a device for repairing a circuit on an array substrate, and an array substrate, which aims to solve the technical problem that the quality of the circuit on the substrate is easy to deteriorate when the circuit on the substrate is repaired in the related art.

In order to achieve the above purpose, the embodiments of the present disclosure propose a method for repairing a circuit on an array substrate. The array substrate includes multiple signal lines, and the method for repairing the circuit on the array substrate includes:

determining a section to be repaired on each signal line;
applying a conductive material to form a repair line between two ends of the section to be repaired, the repair line being connected with two ends of the section to be repaired; and
applying an insulating material to form a cover layer above the repair line, a surface of the repair line being completely covered by the cover layer.

In some embodiments, the operation of applying the conductive material to form the repair line between two ends of the section to be repaired includes:

performing a laser punching operation at two ends of the section to be repaired, to form a via hole to expose the signal line; and
applying the conductive material to form the repair line based on the via hole.

In some embodiments, the operation of performing the laser punching operation at two ends of the section to be repaired includes:

determining a first endpoint at one end of the section to be repaired, and performing the laser punching operation at the first endpoint;
determining an included angle between the signal line and a side of the array substrate; and
determining a second endpoint at the other end of the section to be repaired based on the included angle and the first endpoint, and performing the laser punching operation at the second endpoint.

In some embodiments, the operation of determining the included angle between the signal line and the side of the array substrate includes:

acquiring a light microscope image of the array substrate;
locating the signal line corresponding to the section to be repaired and the side of the array substrate in the light microscope image, to obtain location information; and
determining the included angle between the signal line and the side of the array substrate according to the location information.

In some embodiments, the operation of applying the conductive material to form the repair line based on the via hole includes:

depositing the conductive material in the via hole to form conductive terminals; and
depositing the conductive material between the conductive terminals to form the repair line.

In some embodiments, the operation of applying the insulating material to form the cover layer above the repair line includes:

coating the insulating material on the repair line; and
heating and curing the insulating material to form the cover layer.

In some embodiments, the insulating material is photoresist.

In some embodiments, the photoresist is red color resist, and the operation of coating the insulating material on the repair line includes:

spraying the red color resist on both sides of the repair line, to make the red color resist completely cover the repair line.

Furthermore, in order to achieve the above purpose, the embodiments of the present disclosure propose a device for repairing a circuit on an array substrate, the array substrate includes multiple signal lines, and the device includes:

a positioning structure for determining a section to be repaired on each signal line.
a repairing structure for applying a conductive material to form a repair line between two ends of the section to be repaired, and the repair line is connected with two ends of the section to be repaired.
a protection structure for applying an insulating material to form a cover layer above the repair line, and the cover layer completely covers the surface of the repair line.

In some embodiments, the array substrate includes a glass substrate, a metal layer, an insulating layer and a protective layer laminated together.

In some embodiments, the glass substrate is provided with multiple signal lines, and the signal lines are scanning lines or data lines.

The present disclosure provides a method for repairing a circuit on an array substrate, including: determining a section to be repaired on each signal line, applying a conductive material to form a repair line between two ends of the section to be repaired, the repair line is connected with two ends of the section to be repaired, and applying an insulating material to form a cover layer above the repair line, the cover layer completely covers the surface of the repair line. According to the present disclosure, the section to be repaired on the signal line is replaced by the repair line, and the repair line is covered by the cover layer, so that the signal line can transmit signal normally, which improves the production yield of the array substrate.

The realization of the purpose, functional characteristics, and advantages of the present disclosure will be further described in conjunction with the embodiments and with reference to the accompanying drawings.

DETAILED DESCRIPTION OF THE EMBODIMENTS

It should be understood that the specific embodiments described herein are only used to explain the present disclosure, and are not intended to limit the present disclosure.

Figure 1:
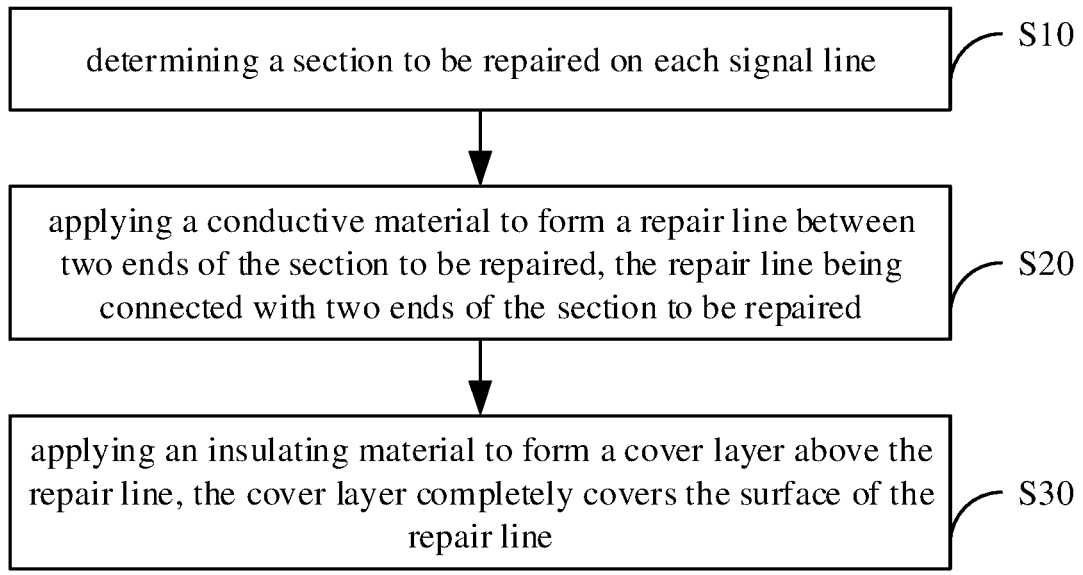
FIG. 1 is a schematic flowchart of a method for repairing a circuit on an array substrate according to an embodiment of the present disclosure.

Referring to FIG. 1, FIG. 1 is a schematic flowchart of a method for repairing a circuit on an array substrate according to an embodiment of the present disclosure.

It can be understood that the array substrate includes multiple signal lines, and the signal lines include scanning lines and data lines which are set across. The array substrate further includes pixels distributed in an array, each row of pixels is driven by a scanning line, and each column of pixels is driven by a data line. Each pixel is electrically connected with a drain of a thin film transistor, a gate of the thin film transistor is connected with one scanning line, and a source of the thin film transistor is connected with one data line.

Generally, the manufacturing process of the array substrate is to prepare each layer of the thin film on a glass substrate. Each layer of the thin film includes two layers of metal films, one layer for the data lines, another layer for the scanning lines. During this manufacturing process, the circuit is often interrupted, or the circuit is too thin. In order to ensure the normal performance of the substrate, such abnormal circuits need to be repaired.

In this embodiment, the method for repairing a circuit on an array substrate includes following operations:

S10, determining a section to be repaired on each signal line.

It can be understood that the executive subject of this embodiment may be a device for repairing a circuit on an array substrate having functions like image processing, data communication and program running. The device for repairing a circuit on an array substrate may include lens, sprayers and other mechanisms. The lens may capture circuit images of the array substrate, and the sprayers may spray various lithography materials. The specific structure of the device for repairing a circuit on an array substrate is well-established, which will not be repeated here in this embodiment.

In a specific implementation, an operator may provide an array substrate to be repaired to the device for repairing a circuit on an array substrate, then start a repairing program on the device for repairing a circuit on an array substrate to execute a method for repairing a circuit on an array substrate in this embodiment.

It should be noted that in this embodiment, the section to be repaired refers to abnormal sections on the signal lines. The abnormal section may include fracture sections or sections with a line width thinner than a normal width. In a specific implementation, the device for repairing a circuit on an array substrate can capture circuit images through the lens and identify a circuit, then determine the section to be repaired of the circuit according to the identification result. Or, the operator judges the circuit according to the circuit images captured through the lens, marks the section to be repaired, then the device for repairing a circuit on an array substrate determines the section to be repaired of the circuit according to the mark.

S20, applying a conductive material to form a repair line between two ends of the section to be repaired, the repair line is connected with two ends of the section to be repaired.

It can be understood that the repair line is mainly for replacing the section to be repaired. Two ends of the repair line are connected correspondingly with two ends of the section to be repaired, so that the signal line can normally transmit signal. In a specific implementation, the conductive materials may be tungsten metals, and the specific metal type may also be selected according to requirements, which is not limited in this embodiment.

Figure 2:
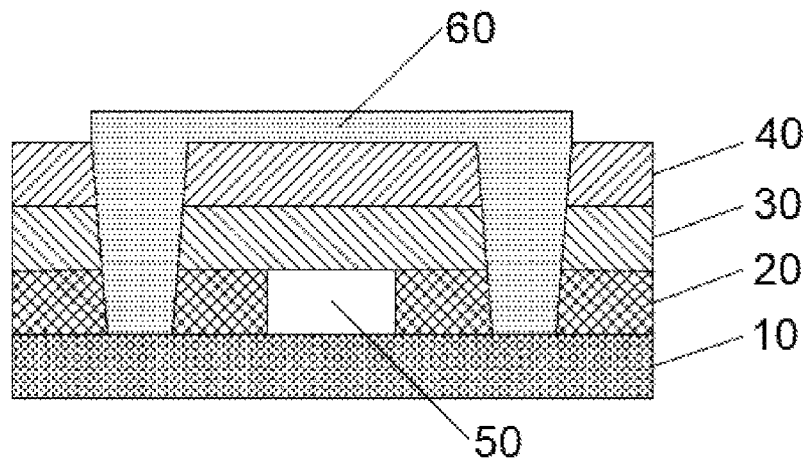
FIG. 2 is a schematic structural diagram of the array substrate when the circuit repair process S20 is completed according to an embodiment of the present disclosure.

Referring to FIG. 2, FIG. 2 is a schematic structural diagram of the array substrate when the circuit repair process S20 is completed according to an embodiment of the present disclosure. The array substrate generally includes a glass substrate 10, a metal layer 20, an insulating layer 30 and a protective layer 40 laminated together. The metal layer 20 may be a metal corresponding to the data lines or a metal corresponding to the scanning lines. A fracture section 50 exists in the metal layer 20, and the fracture section is the section to be repaired. The metal layer 20 may be made of copper, the insulating layer 30 may be made of SiNx, and the protection layer 40 may be a passivation layer (PVX).

When repairing, since the metal layer 20 is covered by the insulating layer 30 and the protection layer 40, it is necessary to remove part of the insulating layer 30 and the protection layer 40. Therefore, S20 may be: performing a laser punching operation at two ends of the section to be repaired to form a via hole to expose the signal line; and applying the conductive material to form the repair line based on the via hole.

It should be noted that the device for repairing a circuit on an array substrate further includes a laser head. The laser punching operation refers to that the device for repairing a circuit on an array substrate uses the laser head to perform laser heating and gasification on the insulating layer 30 and protection layer 40, so as to remove part of the insulating layer 30 and the protection layer 40, and form the via hole. The bottom surface of the via hole is the top surface of the metal layer 20. Two ends of the section to be repaired can extend a distance from the fracture section 50 to both sides.

The distance may be set according to requirements, which is not limited in this embodiment.

In a specific implementation, a repair line 60 can be formed by chemical vapor deposition. The operation of applying the conductive material to form the repair line 60 based on the via hole includes: depositing the conductive material in the via hole to form conductive terminals; and depositing the conductive material between the conductive terminals to form the repair line 60. Generally, the repair line 60 can be a straight line segment, both ends of the repair line 60 are two conductive terminals, and the repair line 60 overlaps the section to be repaired in a vertical direction. Alternatively, the repair line 60 can also be in concave shape, that is, the repair line 60 is led out from the two conductive terminals to one side, and then the two led-out sides are connected to form the repair line 60. At this point, the repair line 60 does not overlap the section to be repaired in a vertical direction.

S30, applying an insulating material to form a cover layer above the repair line, the cover layer completely covers the surface of the repair line.

Figure 3:
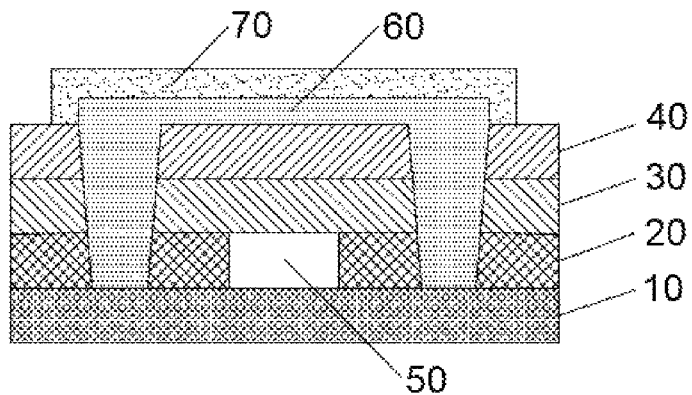
FIG. 3 is a schematic structural diagram of the array substrate when the circuit repair process S30 is completed according to an embodiment of the present disclosure.

Referring to FIG. 3, FIG. 3 is a schematic structural diagram of the array substrate when the circuit repair process S30 is completed according to an embodiment of the present disclosure. It can be understood that a cover layer 70 covers the surface of the repair line 60 to isolate the repair line 60 from the outside, thereby improving the reliability of the circuit. The thickness of the cover layer 70 may be set according to requirements, which is not limited in this embodiment.

In a specific implementation, S30 may be: coating an insulating material on the repair line 60; and heating and curing the insulating material to form the cover layer 70.

It can be understood that the device for repairing a circuit on an array substrate may spray insulating materials on the area where the repair line 60 is located by using a sprayer, so as to coat the insulating materials on the repair line 60. The insulating materials may be photoresist, such as red color resist, green color resist, blue color resist or post spacer (PS) photoresists. Since photoresists are often required to prepare color films in the manufacturing process of the TFT-LCD, coating the existing photoresist as insulating material on the repair line 60 can not only save material, but also do not require additional equipment.

In a specific implementation, the photoresist materials may be red color resist. The operation of coating the insulating material on the repair line 60 includes: spraying red color resist respectively on both sides of the repair line 60, to make the repair line 60 completely covered by the red color resist.

It can be understood, during the spraying process, the red color resist on both ends of the repair line 60 respectively spread around, and when the repair line 60 between both ends is completely covered by the red color resist, the red color resist also covers a certain area of the periphery of the repair line 60, thereby isolating the repair line 60 more completely.

It should be noted that the heating and curing treatment refers to the heat operation of the substrate, and the insulating material is cured by the heat operation to avoid separation. In a specific implementation, the heating temperature of the substrate may be set according to requirements, such as 180° C. or 200° C., which is not limited in this embodiment.

In this embodiment, the method includes: determining a section to be repaired on each signal line, then applying a conductive material to form a repair line between two ends of the section to be repaired, the repair line being connected with two ends of the section to be repaired, finally applying an insulating material to form a cover layer above the repair line, the cover layer completely covers the surface of the repair line. According to this embodiment, the section to be repaired on the signal line is replaced by the repair line, and the repair line is covered by the cover layer, so that the signal line can transmit signal normally, which improves the production yield of the array substrate.

Figure 4:
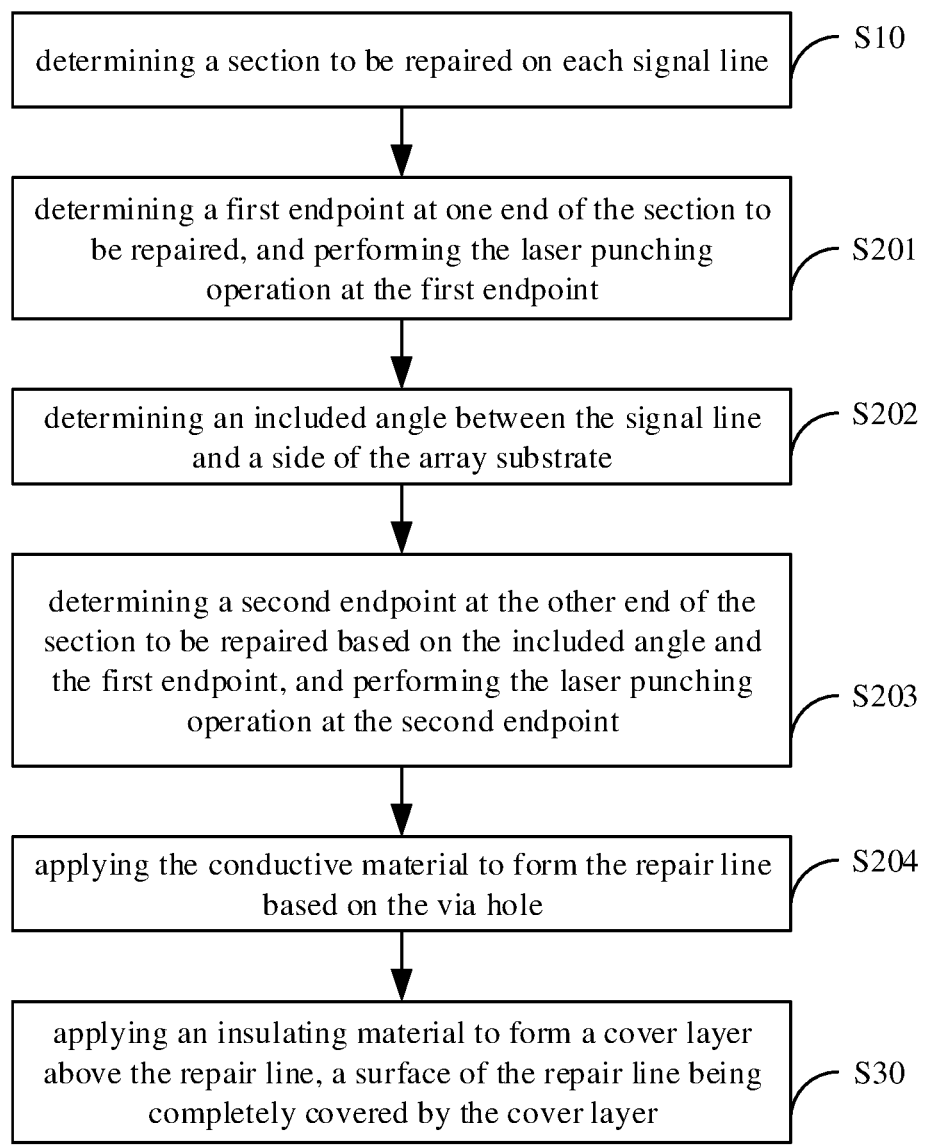
FIG. 4 is a schematic flowchart of a method for repairing a circuit on an array substrate according to another embodiment of the present disclosure.

Referring to FIG. 4, FIG. 4 is a schematic flowchart of a method for repairing a circuit on an array substrate according to another embodiment of the present disclosure.

In this embodiment, S20 may include:

S201: determining a first endpoint at one end of the section to be repaired, and performing the laser punching operation at the first endpoint.

It should be noted that the device for repairing a circuit on an array substrate will select an endpoint as a first endpoint from both ends of the section to be repaired, according to instructions of the operator or a preset rule. For example, an endpoint located at the upper or left side is taken as the first endpoint.

In a specific implementation, the device for repairing a circuit on an array substrate moves the laser head to the position corresponding to the first endpoint and performs the laser punching operation. Referring to FIG. 3 and FIG. 4, the laser punching operation refers to that the device for repairing a circuit on an array substrate uses the laser head to perform laser heating and gasification on the insulating layer 30 and protection layer 40, so as to remove part of insulating layer 30 and the protection layer 40, and form the via hole. Besides, the bottom surface of the via hole is the top surface of the metal layer 20.

S202: determining an included angle between the signal line and a side of the array substrate.

It should be noted that the laser head of the device for repairing a circuit on an array substrate is generally moved in a horizontal or vertical direction. However, since the peripheral trace of the array substrate and the edge of the glass substrate are inclined to form an included angle, it is prone to deviation when punching the other end of the section to be repaired.

Figure 5:
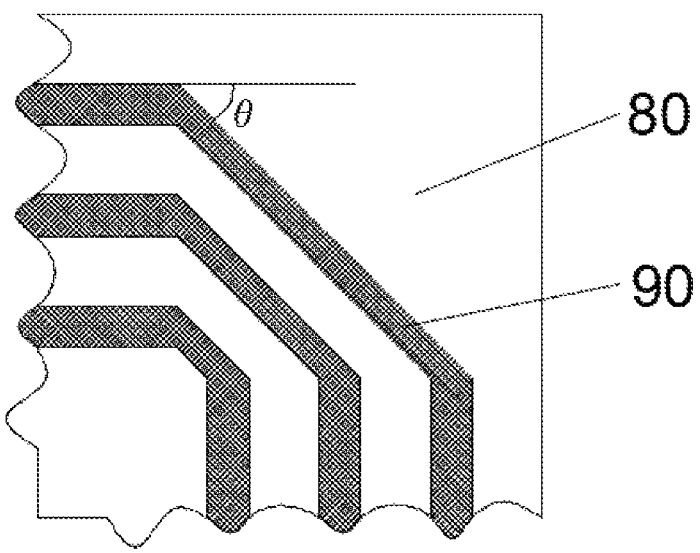
FIG. 5 is a schematic diagram of the signal lines routing according to an embodiment of the present disclosure.

Referring to FIG. 5, FIG. 5 is a schematic diagram of the signal line routing according to an embodiment of the present disclosure. Multiple signal lines 90 are provided on a glass substrate 80. There is an inclined line between the horizontal line and the vertical line of the signal lines 90, and the angle between the inclined line and the edge of the glass substrate 80 is θ. If the section to be repaired is located on the inclined line, it is easy to be deviated during laser punching.

It should be noted that the signal lines 90 are generally made of copper, for reducing the resistance of the circuit in high-performance machines such as Ultra High Definition (UD), 4K and 8K. In high-performance machines, the width of the signal lines 90 is relatively narrow. If there are problems such as deviation during the laser punching of the via hole, part of the side of the lines will be exposed, causing corrosion and gradation, which will affect the instructions of the substrate.

In a specific implementation, S202 may be: acquiring a light microscope image of the array substrate; locating the signal line corresponding to the section to be repaired and the side of the array substrate in the light microscope image, to obtain location information; and determining the included angle between the signal line and the side of the array substrate according to the location information.

It should be noted that the light microscope image is an image captured by the device for repairing a circuit on an array substrate through the lens. The device for repairing a circuit on an array substrate identifies the circuit and the substrate in the light microscope image based on image recognition algorithms, and obtains the outline information of the glass substrate 80 and the signal lines 90. The location information refers to the distance between the outline of the glass substrate 80 and the outline of the signal lines 90, etc. The device for repairing a circuit on an array substrate can also calculate the included angle between the signal line and the side of the array substrate based on the outline information according to a preset location algorithm.

It should be noted that the device for repairing a circuit on an array substrate determines the included angle between the signal line 90 and the side of the array substrate according to θ angle parameter input by the operator. Besides, other means may also be adopted to determine this included angle, which is not limited in this embodiment.

S203: determining a second endpoint at the other end of the section to be repaired based on the included angle and the first endpoint, and performing the laser punching operation at the second endpoint.

It can be understood, the laser head in the device for repairing a circuit on an array substrate determines the second endpoint after completing the laser punching operation at the first endpoint. Specifically, the laser head is moved to the other end of the section to be repaired by a preset distance horizontally or vertically, then a compensation distance is calculated based on the included angle, and then the laser head is moved in the other direction by the compensation distance (if the laser head is moved horizontally before compensation, then the laser head is moved vertically at this time), and the laser head stops at the second endpoint.

Certainly, the device for repairing a circuit on an array substrate can also be provided with multiple laser heads. After the position of the first endpoint is determined, the position of the second endpoint is calculated according to the above included angle, and then the two laser heads are moved to the first and second endpoints respectively, so as to perform the laser punching operation at the same time.

S204: applying the conductive material to form the repair line based on the via hole. It can be understood that after the via hole is formed, firstly the conductive material is deposited in two via holes to form two conductive terminals, then the conductive material is deposited between the two conductive terminals to form the repair line. In the process of depositing conductive material between the two conductive terminals, the moving track of the sprayer that sprays the conductive material also needs to be corrected according to the included angle. If the moving track of the sprayer can only be horizontal or vertical, two transition sections need to be led out from the two conductive terminals to one direction respectively. These two transition sections have overlapping parts in horizontal or vertical direction. The sprayer can connect the overlapping parts of the two transition sections by moving horizontally or vertically to form the repair line.

In the present disclosure, the method includes: determining a first endpoint at one end of the section to be repaired, and performing the laser punching operation at the first endpoint, then determining an included angle between the signal line and a side of the array substrate, then determining a second endpoint at the other end of the section to be repaired based on the included angle and the first endpoint, and performing the laser punching operation at the second endpoint, and finally forming the repair line based on the via hole by applying conductive material. According to this embodiment, the laser punching position is corrected through the included angle between the signal line and edge of the array substrate, so as to avoid position deviation of the via hole, ensure the accuracy of the punching position, and improve the production yield of the array substrate.

Figure 6:
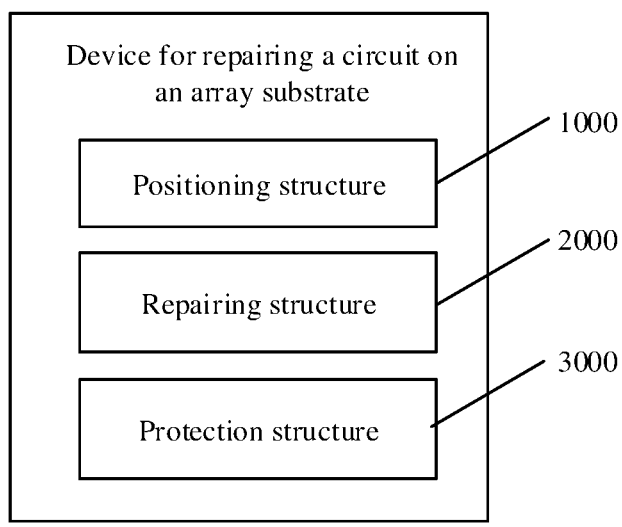
FIG. 6 is a structural block diagram of a device for repairing a circuit on an array substrate according to an embodiment of the present disclosure.

Furthermore, referring to FIG. 6, FIG. 6 is a structural block diagram of a device for repairing a circuit on an array substrate according to an embodiment of the present disclosure.

In this embodiment, the device for repairing a circuit on an array substrate includes: a positioning structure 1000, a repairing structure 2000 and a protection structure 3000.

The positioning structure 1000 is for determining a section to be repaired on each signal line.

The repairing structure 2000 is for applying a conductive material to form a repair line between two ends of the section to be repaired, and the repair line is connected with two ends of the section to be repaired.

The protection structure 3000 is for applying an insulating material to form a cover layer above the repair line, and the cover layer completely covers the surface of the repair line.

In the present disclosure, the positioning structure 1000 determines the section to be repaired on the signal line on the array substrate, the repairing structure 2000 applies the conductive material to form the repair line between the two ends of the section to be repaired, the repair line is connected with two ends of the section to be repaired, the protection structure 3000 applies the insulating material to form the cover layer above the repair line. The cover layer completely covers the surface of the repair line. According to the present disclosure, the section to be repaired on the signal line is replaced by the repair line, and the repair line is covered by the cover layer, so that the signal line can transmit signal normally, which improves the production yield of the array substrate.

In some embodiments, the repairing structure 2000 is further for performing a laser punching operation at two ends of the section to be repaired to form a via hole to expose the signal line; and applying the conductive material to form the repair line based on the via hole.

In some embodiments, the repairing structure 2000 is further for determining a first endpoint at one end of the section to be repaired, and performing the laser punching operation at the first endpoint; and determining an included angle between the signal line and a side of the array substrate, then determining a second endpoint at the other end of the section to be repaired based on the included angle and the first endpoint, and performing the laser punching operation at the second endpoint.

In some embodiments, the repairing structure 2000 is further for acquiring a light microscope image of the array substrate; locating the signal line corresponding to the section to be repaired and the side of the array substrate in the light microscope image, and obtaining location information; determining the included angle between the signal line and the side of the array substrate according to the location information.

In some embodiments, the repairing structure 2000 is further for depositing the conductive material in the via hole to form conductive terminals; and depositing the conductive material between the conductive terminals to form the repair line.

In some embodiments, the protection structure 3000 is further for coating insulating material on the repair line; and heating and curing the insulating material to form the cover layer.

For other embodiments or specific implementation manners of the device for repairing a circuit on an array substrate of the present disclosure, reference may be made to the foregoing method embodiments, it at least has all the beneficial effects brought by the technical solutions of the above-mentioned embodiments, which will not be repeated here.

Furthermore, the present disclosure further provides an array substrate which is manufactured according to the above-mentioned method for repairing a circuit on an array substrate. Since the array substrate adopts all the technical solutions of all the above-mentioned embodiments, it at least has all the beneficial effects brought by the technical solutions of the above-mentioned embodiments, which will not be repeated here.

Figure 7:
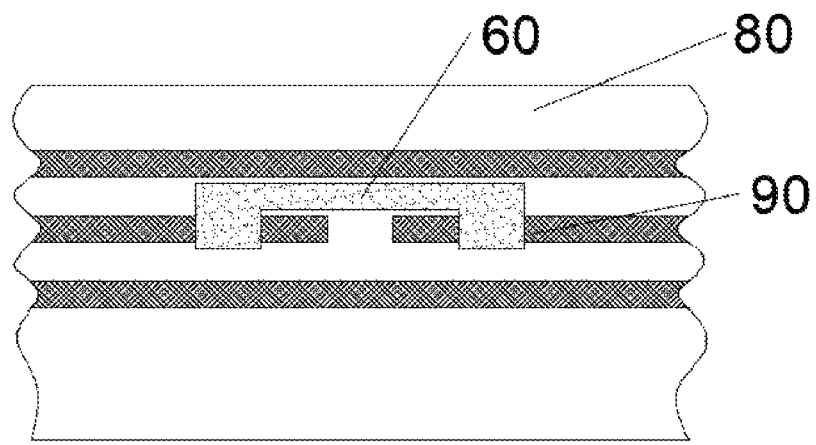
FIG. 7 is a partial top view of an array substrate according to an embodiment of the present disclosure.

Referring to FIG. 7, FIG. 7 is a partial top view of an array substrate according to an embodiment of the present disclosure. The array substrate includes a glass substrate 80 which can be provided with multiple signal lines 90. Specifically, the signal lines 90 may be scanning lines or data lines. In this embodiment, the corresponding fracture signal lines 90 are repaired, and the repair line 60 is formed at that fracture position. The repair line 60 is for connecting the signal lines 90 at both sides of the fracture position.

It should be noted that in this document, the terms "comprise", "include" or any other variants thereof are intended to cover a non-exclusive inclusion. Thus, a process, method, article, or system that includes a series of elements not only includes those elements, but also includes other elements that are not explicitly listed, or also includes elements inherent to the process, method, article, or system. If there are no more restrictions, the element defined by the sentence "including a . . . " does not exclude the existence of other identical elements in the process, method, article or system that includes the element.

The above-mentioned serial numbers of the embodiments of the present disclosure are merely for description and do not represent the merits of the embodiments. In the unit claims enumerating several means, several of these means may be embodied by one and the same item of hardware. The use of the words first, second, third, etc. do not denote any order, but rather the words first, second, third, etc. are to be interpreted as names.

Through the above description of the embodiments, those skilled in the art will clearly understand that the method of the above embodiments can be implemented by software plus a necessary general hardware platform, and certainly can also be implemented by hardware, but in many cases, the former is a better implementation manner. Based on such understanding, the technical solutions of the present disclosure or portions thereof that contribute to the prior art may be embodied in the form of a software product, where the computer software product is stored in a storage medium (e.g., a Read Only Memory (ROM)/Random Access Memory (RAM), a magnetic disk, an optical disk), and includes several instructions for enabling a terminal device (which may be a mobile phone, a computer, a server, or a network device) to execute the method according to the embodiments of the present disclosure.

The above are only some embodiments of the present disclosure, and do not limit the scope of the present disclosure thereto. Under the concept of the present disclosure, any equivalent structural transformations made according to the description and drawings of the present disclosure, or any direct/indirect application in other related technical fields are included in the scope of the present disclosure.

What is claimed is:

1. A method for repairing a circuit on an array substrate, wherein the array substrate comprises multiple signal lines, and the method comprises following operations:
   determining a section to be repaired on each signal line;
   applying a conductive material to form a repair line between two ends of the section to be repaired, the repair line being connected with the two ends of the section to be repaired; and
   applying an insulating material to form a cover layer above the repair line, a surface of the repair line being completely covered by the cover layer;
   wherein the operation of applying the conductive material to form the repair line between two ends of the section to be repaired comprises:
   performing a laser punching operation at the two ends of the section to be repaired, to form a via hole to expose the signal line; and
   applying the conductive material to form the repair line based on the via hole;
   wherein the two ends of the section comprise a first endpoint and a second endpoint; the operation of performing the laser punching operation at the two ends of the section to be repaired comprises:
   determining a first endpoint at one end of the section to be repaired, and performing the laser punching operation at the first endpoint;
   determining an included angle between the signal line and a side of the array substrate; and
   determining a second endpoint at the other end of the section to be repaired based at least on the included angle and the first endpoint, and performing the laser punching operation at the second endpoint.

2. The method of claim 1, wherein the operation of determining the included angle between the signal line and the side of the array substrate comprises:
   acquiring a light microscope image of the array substrate;
   locating the signal line corresponding to the section to be repaired and the side of the array substrate in the light microscope image, to obtain location information; and
   determining the included angle between the signal line and the side of the array substrate according to the location information.

3. The method of claim 1, wherein the operation of applying the conductive material to form the repair line based on the via hole comprises:
   depositing the conductive material in the via hole to form conductive terminals; and
   depositing the conductive material between the conductive terminals to form the repair line.

4. The method of claim 1, wherein the operation of applying the insulating material to form the cover layer above the repair line comprises:
   coating the insulating material on the repair line; and
   heating and curing the insulating material to form the cover layer.

5. The method of claim 4, wherein the insulating material is photoresist.

6. The method of claim 5, wherein the photoresist is red color resist, and the operation of coating the insulating material on the repair line comprises:
   spraying the red color resist on both sides of the repair line, to make the red color resist completely cover the repair line.

7. The method of claim 1, wherein the array substrate comprises a glass substrate, a metal layer, an insulating layer and a protective layer laminated together, and the laser punching operation comprises:

using a laser head to perform laser heating and gasification on the insulating layer and protection layer, to remove part of the insulating layer and the protection layer, and form the via hole.

8. A device for repairing a circuit on an array substrate, wherein the array substrate comprises multiple signal lines, and the device comprises:
- a positioning structure for determining a section to be repaired on each signal line;
- a repairing structure for applying a conductive material to form a repair line between two ends of the section to be repaired, the repair line being connected with the two ends of the section to be repaired; and
- a protection structure for applying an insulating material to form a cover layer above the repair line, a surface of the repair line being completely covered by the cover layer;
- wherein the repairing structure is further for:
- performing a laser punching operation at the two ends of the section to be repaired, to form a via hole to expose the signal line; and
- applying the conductive material to form the repair line based on the via hole;
- wherein the two ends of the section comprise a first endpoint and a second endpoint; the repairing structure is further for:
- determining a first endpoint at one end of the section to be repaired, and performing the laser punching operation at the first endpoint;
- determining an included angle between the signal line and a side of the array substrate; and
- determining a second endpoint at the other end of the section to be repaired based at least on the included angle and the first endpoint, and performing the laser punching operation at the second endpoint.

9. An array substrate manufactured by a method for repairing a circuit on an array substrate, the array substrate comprising multiple signal lines, wherein the method comprises:
- determining a section to be repaired on each signal line;
- applying a conductive material to form a repair line between two ends of the section to be repaired, the repair line being connected with the two ends of the section to be repaired; and
- applying an insulating material to form a cover layer above the repair line, a surface of the repair line being completely covered by the cover layer;
- wherein the operation of applying the conductive material to form the repair line between two ends of the section to be repaired comprises:
- performing a laser punching operation at the two ends of the section to be repaired, to form a via hole to expose the signal line; and
- applying the conductive material to form the repair line based on the via hole;
- wherein the two ends of the section comprise a first endpoint and a second endpoint; the operation of performing the laser punching operation at the two ends of the section to be repaired comprises:
- determining a first endpoint at one end of the section to be repaired, and performing the laser punching operation at the first endpoint;
- determining an included angle between the signal line and a side of the array substrate; and
- determining a second endpoint at the other end of the section to be repaired based at least on the included angle and the first endpoint, and performing the laser punching operation at the second endpoint.

10. The array substrate of claim 9, wherein the array substrate comprises a glass substrate, a metal layer, an insulating layer and a protective layer laminated together.

11. The array substrate of claim 10, wherein the glass substrate is provided with multiple signal lines, and the signal lines are scanning lines or data lines.

* * * * *